United States Patent [19]

Comfort et al.

[11] Patent Number: 5,266,813
[45] Date of Patent: Nov. 30, 1993

[54] ISOLATION TECHNIQUE FOR SILICON GERMANIUM DEVICES

[75] Inventors: James H. Comfort, Yorktown Heights; David L. Harame, Mohegan Lake; Scott R. Stiffler, Brooklyn, all of N.Y.

[73] Assignee: International Business Machines Corporation, Armonk, N.Y.

[21] Appl. No.: 825,230

[22] Filed: Jan. 24, 1992

[51] Int. Cl.⁵ .............................................. H01L 31/12
[52] U.S. Cl. ...................................... 257/19; 257/200; 257/201; 257/616
[58] Field of Search ................... 257/616, 19, 200, 201

[56] References Cited

U.S. PATENT DOCUMENTS

| | | | |
|---|---|---|---|
| 4,771,326 | 9/1988 | Curran | 257/19 X |
| 4,806,996 | 2/1989 | Luryi | 357/16 |
| 4,959,694 | 9/1990 | Gell | 357/16 |
| 5,006,912 | 4/1991 | Smith | 357/34 |
| 5,019,882 | 5/1991 | Solomon | 357/23.8 |
| 5,155,571 | 10/1992 | Wang et al. | 257/19 |

FOREIGN PATENT DOCUMENTS

| | | | |
|---|---|---|---|
| 63-308966 | 12/1988 | Japan | 257/616 |
| 1-296664 | 11/1989 | Japan . | |
| 2-091948 | 3/1990 | Japan . | |

*Primary Examiner*—William Mintel
*Attorney, Agent, or Firm*—Blaney Harper; Robert M. Trepp

[57] ABSTRACT

The present invention is an isolation structure for use with FET or bipolar devices incorporating a silicon-germanium layer in which the semiconductor devices are isolated by trench structures. A trench is etched through a pad layer, a single crystal silicon layer, a silicon-germanium layer, and finally, into the silicon substrate. The silicon-germanium layer is interposed between the single crystal silicon layer and the silicon substrate and the pad layer covers the single crystal silicon layer. The trench sidewall exposes the silicon-germanium layer. A single crystal silicon layer is formed as a trench liner. This silicon trench liner is then oxidized to passivate the trench isolation. The trench can then be filled with a dielectric without the devices being affected by parasitic leakage caused by the silicon-germanium layer exposed by the trench isolation.

14 Claims, 1 Drawing Sheet

ISOLATION TECHNIQUE FOR SILICON GERMANIUM DEVICES

FIELD OF THE INVENTION

This invention relates generally to the field of semiconductor devices. In particular, this invention relates to the isolation of FET and Bipolar semiconductor devices having a silicon germanium layer. More particularly, this invention relates to a trench isolation structure, and method for making the isolation structure, for FET and Bipolar devices having a silicon germanium layer.

BACKGROUND OF THE INVENTION

Field effect transistor (FET) devices are horizontal devices having a source, a drain spaced apart from the source, and a gate disposed between the source and drain. The source and drain regions are heavily doped semiconductor regions in which the source is doped with the same conductivity type of dopant (either n or p) as the drain. A channel region lies underneath the gate and between the source and the drain. The gate is formed of a gate electrode and a dielectric layer. The dielectric layer is interposed between the gate electrode and the channel region. A voltage imposed on the gate electrode controls the flow of current from the source to the drain within the channel. The performance of the FET is improved by improving the speed with which current carriers make the transition between the source and drain. A bipolar transistor is generally a vertical device having a moderately doped base region interposed between a heavily doped emitter region and a lightly doped collector region. The emitter and collector are doped with one conductivity type of dopant (either n or p) and the base is doped with a second conductivity type of dopant (either p or n respectively). The emitter-base junction is forward biased while the collector-base junction is reverse biased. The forward biased emitter-base junction of an NPN injects electrons (holes for a PNP) into the base region. The base region is sufficiently narrow such that a significant amount of carriers which are injected into the base region reach the collector-base junction. The reverse bias on the collector base junction sweeps electrons (holes) which reach the collector base junction into the collector. The performance of the bipolar device is improved by improving the speed with which carriers travel from the emitter to the collector and decreasing the number of carriers which are lost, through parasitic leakages, during the transition from the emitter to the collector.

FET and Bipolar devices are generally manufactured in silicon. This is because the conductivity of silicon can be easily altered by doping the silicon with a suitable dopant species. Also, silicon is easy to work with because it can be easily oxidized and oxidized silicon is nonreactive with many processing agents. One of the disadvantages of using silicon for semiconductor devices is that the electron mobility is relatively low. A low electron mobility decreases the performance of an FET device because a low electron mobility decreases the speed with which electrons make the transition between the source and the drain. A low electron mobility decreases the performance of a bipolar device because a low electron mobility decreases the speed with which electrons travel across the base region of the device. Also, the slower that electrons travel across the base region, the higher the probability that those electrons will be leaked off the base region by a parasitic component.

In order to increase the carrier mobility of silicon semiconductor devices, layers containing germanium have been incorporated into the structure of the silicon semiconductor device. Germanium has a higher electron and hole mobility than silicon. The prior art has demonstrated that a layer of germanium and silicon can be grown on a silicon substrate so long as the alloy layer is thin enough. The lattice spacing of crystalline germanium is larger than the lattice spacing in crystalline silicon. The difference in lattice spacings produces a lattice strain on the alloy layer. Two dimensional electron and hole gas layers can be formed in such strained alloy layers. These electron and hole gas layers have enhanced electron and hole mobilities when compared to silicon. The FET device structure which takes advantage of the silicon-germanium alloy includes a silicon-germanium alloy layer covered by a silicon layer in the channel region of the FET device. Similarly, the bipolar structure which takes advantage of the silicon-germanium alloy layer includes a silicon-germanium alloy layer in the base region between the emitter and collector of the bipolar device. In both types of semiconductor devices, the inclusion of the silicon-germanium layer increases the performance of the semiconductor device.

The basic problem with the incorporation of the silicon-germanium layer into the semiconductor devices is that many semiconductor devices must be made on the same silicon substrate and they must be isolated from each other. The semiconductor devices must be isolated to prevent parasitic leakages from one device affecting another device. Typical junction and oxide isolation are effective in isolating devices, however, these types of isolation take up too much area and do not allow a sufficient number of devices to be placed in a unit of area on the silicon substrate. Trench isolation is a type of isolation which would be both effective and permit the required device density. The problem with trench isolation is that the trench disrupts the silicon lattice and causes parasitic leakage from the device which the trench isolates. This leakage is more severe in devices incorporating a silicon-germanium layer because the trench cuts through a strained silicon-germanium layer which creates more of a disruption in the semiconductor lattice. Typically, the problem of parasitic leakaged associated with trench isolation is cured with various insulating layers grown or deposited on the sidewall of the trench. This approach does not work with a semiconductor device incorporating a silicon-germanium layer because the insulating layers grown or deposited on the surface of the silicon-germanium layer do not address the enhanced sidewall leakage due to the strain in the silicon-germanium lattice structure.

OBJECTS OF THE INVENTION

It is an object of the present invention to manufacture semiconductor devices having silicon-germanium alloys.

It is a further object of the present invention to manufacture FET and bipolar devices incorporating silicon-germanium alloy layers.

It is still another object of the present invention to manufacture FET and bipolar devices incorporating silicon-germanium alloy layers and trench isolation.

It is still a further object of the present invention to manufacture high performance FET and bipolar devices incorporating silicon-germanium alloy layers and trench isolation.

SUMMARY OF THE INVENTION

The present invention is an isolation structure for use with FET or bipolar devices incorporating a silicon-germanium layer in which the semiconductor devices are isolated by trench structures. A trench is etched through a pad layer, a single crystal silicon layer, a silicon-germanium layer, and finally, into the silicon substrate. The silicon-germanium layer is interposed between the single crystal silicon layer and the silicon substrate and the pad layer covers the single crystal silicon layer. The trench sidewall exposes the silicon-germanium layer. A single crystal silicon layer is formed as a trench liner. This silicon trench liner is then oxidized to passivate the trench isolation. The trench can then be filled with a dielectric without the devices being affected by parasitic leakage caused by the silicon-germanium layer exposed by the trench isolation.

DESCRIPTION OF THE PREFERRED EMBODIMENT

Figure 1:
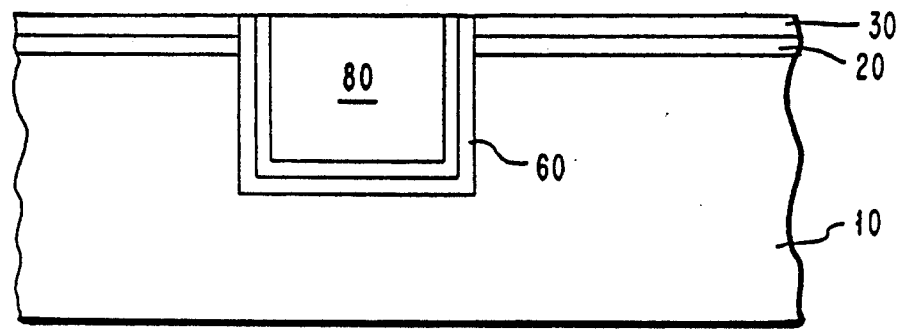
FIG. 1 illustrates the isolation structure of the present invention.

FIG. 1 illustrates the isolation structure of the present invention. The silicon substrate 10 has a trench 15 etched into it. The trench 15 cuts through unstrained silicon layer 30 and a silicon-germanium layer 20. The trench can be of arbitrary depth but is typically 0.5 to 5 microns deep. The silicon-germanium layer 20 is approximately 50 to 1,000 Angstroms (Å) thick. More particularly, in an FET structure the layer 20 is approximately 50 to 400 Å thick and in a bipolar structure the layer 20 is approximately 300 to 900 Å thick. The unstrained silicon layer 30 is typically 50 to 500 Å thick. More particularly, the layer 30 is 50 to 200 Å thick in an FET device and 100 to 500 Å thick in a bipolar structure. The trench 15 is covered with an unstrained silicon layer 60. The unstrained silicon layer 60 is approximately 100 Å thick but can range from 5 Å to 500 Å in thickness. The unstrained silicon layer 60 is covered by a dielectric layer 70. The dielectric layer 70 is preferrably thermally grown silicon dioxide but could also be deposited silicon nitride or the like. The thickness of the dielectric layer 70 is typically 200 Å and can range from 100 to 500 Å. Finally, the remaining volume of the trench is filled with dielectric 80. Dielectric 80 is preferrably silicon dioxide, nitride, or intrinsic polysilicon but can be a variety of other conventional dielectric materials.

Figure 2:
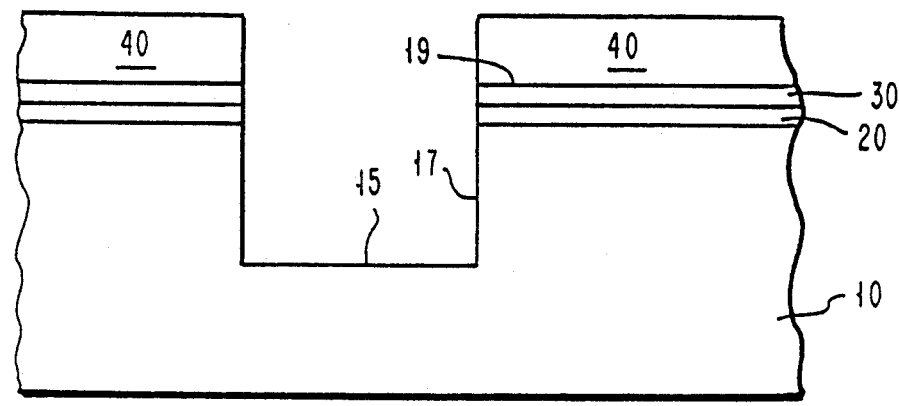
FIG. 2 illustrates the isolation structure of the present invention at an intermediate fabrication stage.

FIG. 2 illustrates the isolation structure at an intermediate stage in manufacturing the structure. A single crystal silicon substrate 10 is the base on which semiconductor devices are formed. A silicon-germanium alloy layer 20 is deposited on the substrate 10. The silicon-germanium layer 20 is deposited by an ultra high vaccum chemical vapor deposition (UHVCVD) process. This process uses a hot-wall isothermal furnace, in which gaseous growth sources such as silane (SiH4) and germane (GeH4) are pyrolyzed to form films on wafers placed coaxially in the furnace. Unique to the UHVCVD process is the absence of any form of in-situ cleaning. The UHVCVD process relies solely upon stringent adherence to proper and well known vaccum procedures to maintain an atomically bare wafer surface prior to the deposition. The film growth rate is approximately 80 Å/minute at 550 degrees celcius when 10% of the silane/germane gas source is germane. The silicon-germanium layer 20 could also be deposited by other techniques such as molecular beam epitaxy or an atmospheric CVD process. The silicon-germanium layer comprises $Si_{1-x}Ge_x$ wherein X determines the relative amounts of silicon and germanium and ranges between approximately 0.01 and 0.99. X is preferrably 0.5. The $Si_{1-x}Ge_x$ layer is approximately 150 Å thick and is covered by an unstrained silicon layer 30. The unstrained silicon layer is also formed by a CVD deposition process. The process is the same UHVCVD process as explained above except only silane is used as the gaseous source. Again, the silicon layer could be formed from other processes such as molecular beam epitaxy or an atmospheric CVD process. The unstrained silicon layer 30 is 50 to 500 Å thick and the unstrained silicon layer 30 is a single crystal silicon layer.

Once the unstrained silicon layer 30 is formed, the unstrained silicon layer 30 is covered by a pad layer 40. The pad layer 40 is a layer on which single crystal silicon will not typically form. The pad layer 40 is preferrably a layer of silicon dioxide or silicon nitride but could be a variety of other materials on which single crystal silicon will not form. The pad layer 40 is approximately 2,000 Å thick but could range from 500 to 5,000 Å thick. Once the pad layer 40 is deposited, a photolithography step defines the trench areas. The photolithography step consists of depositing and developing photoresist such that some areas of the pad are covered by cured photoresist and others are not. The entire structure is then subjected to a reactive ion etch (RIE) process. The RIE process etches through the pad, unstrained silicon, and silicon-germanium layer and stops in the silicon subtrate in those areas not protected by the photoresist. The sidewalls of the trench 17 are preferrably perpendicular to the generally planar surface surface 19 of the silicon layer 30. This is because more dense devices can be built with perpendicular sidewalls. However, the sidewalls 17 need not be perpendicular and can form a V grove or other angle with surface 19 which is not perpendicular. After the RIE process is complete, the remaining resist is stripped off which leaves the structure of FIG. 2.

Figure 3:
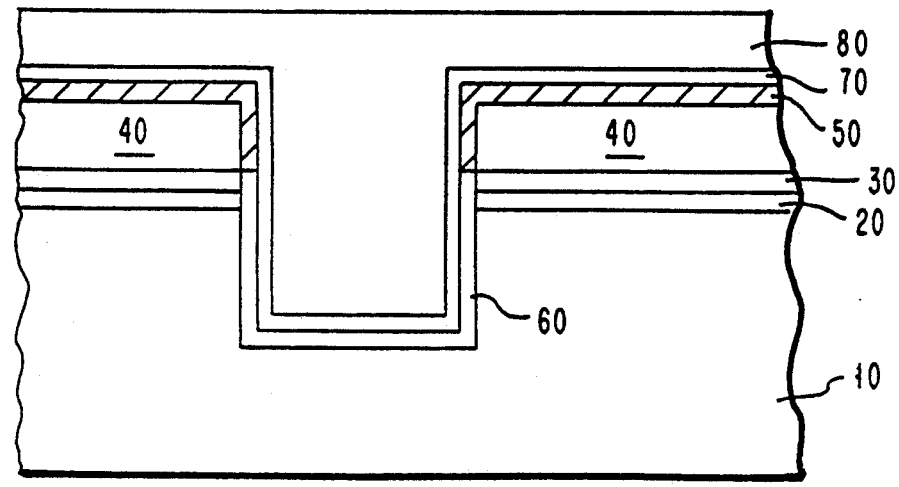
FIG. 3 illustrates the isolation structure of the present invention after the formation of the trench insulator layers.

Once the trench 15 has been formed, vertical portions of the unstrained silicon layer 30, the silicon substrate, and the silicon-germanium layer 20 are exposed. These exposed surfaces are paths for parasitic leakages to drain off current flowing in devices formed in layers 20 and 30. This parasitic leakage is stopped by oxidizing the trench sidewall in a typical silicon only device. However, merely oxidizing the trench sidewall in a silicon germanium device does not stop leakage. There are two reasons for this. First, the oxide resides over a stressed silicon-germanium lattice and the stress in the lattice creates the leakage. Second, an oxidized silicon-germanium surface is very leaky due to surface states generated by the oxidation. Therefore, FIG. 3 illustrates that a layer of silicon 60 is deposited in the trench, over the silicon-germanium lattice, in the present invention instead of merely oxidizing the trench sidewall. The added silicon sidewall layer relieves the lattice stress and any oxidation is done on a pure silicon layer so that excess surface states are not created. As a result, the trench sidewall leakage in a silicon germanium device is reduced. The silicon layer 60, having a thickness of between 5 and 500 Å, is deposited in an epitaxial system which deposits a conformal layer such as a UHVCVD process or a conventional atmospheric CVD process. The epitaxial layer of silicon is deposited both in the trench and on the surface of the pad layer 40. The epitaxial silicon layer remains single crystal silicon in the trench because it is deposited on a surface which supports the growth of a single crystal silicon layer. The silicon substrate 10, unstrained silicon layer 30, and the silicon-germanium layer 20 support the growth of a single crystal silicon lattice.

The epitaxial silicon which is deposited on the pad layer 40 does not form a single crystal silicon layer. Silicon which is deposited on the pad layer 40 forms a polysilicon layer 50. The single crystal silicon layer 60 and the polysilicon layer 50 are not insulators. These layers are semiconductor layers which must be passivated as in any semiconductor device. However, unstrained silicon is easy to passivate. In particular, the unstrained silicon layers 50 and 60 can be passivated by thermal oxidation which forms the insulator silicon dioxide. The thermal passivation cannot be so thick so as to consume all the underlying silicon layer 60 in the formation of the silicon dioxide layer. When the silicon dioxide or other dielectric is deposited over the silicon layer 60, then no such restraint is imposed. In particular, when the silicon layer 60 is very thin (on the order of 5 to 20 Å) the dielectric layer 70 is a deposited (rather than grown) dielectric. A silicon dioxide layer 70 is formed over the single crystal silicon layers 50 and 60. The silicon dioxide film 70 is approximately 100 Å thick but can range from 50 to 1,000 Å thick. Once the passivation layer 70 is formed, the trench 15 is filled with dielectric 80. Dielectric 80 is typically a deposited silicon dioxide but can also be polysilicon or other well known trench fill material. The trench 15 is filled above the unstrained silicon layer 30 and typically covers the entire surface of the device as shown in FIG. 3.

After the trench 15 has been filled, the structure illustrated in FIG. 3 is blanket etched and planarized down to the top surface of unstrained silicon layer 30 using one of a variety of conventional planarization techniques. A particular implementation of a planarization technique is to spin on a blanket resist and pattern this first resist with a block mask. The block mask is merely the inversion of the trench mask with some compensation for minimum image sizes. The patterned resist is then covered with a second blanket resist layer. finally, the resist and top silicon dioxide layer 70, polysilicon layer 50, and pad layer 40 are etched back to the underlying silicon layer 30. The etchback employed a conventional plasma etch system using $NF_3$ chemistry. The etch is done at 550 watts, 150 mTorr pressure, and 25 sccm of $NF_3$. The resulting structure is shown in FIG. 1. FET and bipolar device processing is then performed on the structure of FIG. 1 to add the semiconductor devices to the areas defined by the isolation regions. The FET and bipolar devices are not subject to parasitic leakage from the trench isolation because the exposed surface of the silicon-germanium layer 20 is covered by silicon which is at least 50 Å thick. This layer is then covered with a conventional silicon dioxide region which stops leakage through the exposed silicon surface.

While the invention has been described and illustrated with respect to plural embodiments thereof, it will be understood by those skilled in the art that various changes in the detail may be made therein without departing from the spirit, scope, and teaching of the invention. Therefore, the invention disclosed herein is to be limited only as specified in the following claims.

Having thus described our invention what we claim as new and desire to secure as Letters Patent, is:

1. A semiconductor device, comprising:
a substrate having a silicon-germanium layer;
said substrate having a trench formed in said substrate, said trench formed through said silicon-germanium layer and forming a sidewall in said substrate;
said sidewall covered by a silicon layer wherein said silicon layer covers a surface of said silicon-germanium layer.

2. A semiconductor device, as in claim 1, wherein:
said substrate has a major surface lying substantially in a first plane, said sidewall has a major surface lying in a second plane, and said first plane is substantially perpendicular to said second plane.

3. A semiconductor device, as in claim 1, wherein:
said substrate has a major surface lying substantially in a first plane, said sidewall has a major surface lying in a second plane, and said first plane is substantially non-perpendicular to said second plane.

4. A semiconductor device, as in claim 2, wherein:
said substrate comprises a silicon-germanium layer interposed between first and second silicon substrate layers.

5. A semiconductor device, as in claim 3, wherein:
said substrate comprises a silicon-germanium layer interposed between first and second silicon substrate layers.

6. A semiconductor device, as in claim 4, wherein:
said silicon-germanium layer has a thickness between approximately 50 and 1,000 Å.

7. A semiconductor device, as in claim 5, wherein:
said silicon-germanium layer has a thickness between approximately 50 and 1,000 Å.

8. A semiconductor device, comprising:
a substrate having a silicon-germanium layer;
said substrate having a trench formed in said substrate, said trench formed through said silicon-germanium layer and forming a sidewall in said substrate;
said sidewall covered by a silicon layer having a thickness of between approximately 5 and 500 Å wherein said silicon layer covers a surface of said silicon-germanium layer.

9. A semiconductor device, as in claim 8, wherein:
said substrate has a major surface lying substantially in a first plane, said sidewall has a major surface lying in a second plane, and said first plane is substantially perpendicular to said second plane.

10. A semiconductor device, as in claim 8, wherein:
said substrate has a major surface lying substantially in a first plane, said sidewall has a major surface lying in a second plane, and said first plane is substantially non-perpendicular to said second plane.

11. A semiconductor device, as in claim 9, wherein:

said substrate comprises a silicon-germanium layer interposed between first and second silicon substrate layers.

12. A semiconductor device, as in claim 10, wherein: said substrate comprises a silicon-germanium layer interposed between first and second silicon substrate layers.

13. A semiconductor device, as in claim 11, wherein: said silicon-germanium layer has a thickness between approximately 50 and 1,000 Å.

14. A semiconductor device, as in claim 12, wherein: said silicon-germanium layer has a thickness between approximately 50 and 1,000 Å.

* * * * *